United States Patent
Lewis

(10) Patent No.: US 7,162,682 B2
(45) Date of Patent: Jan. 9, 2007

(54) METHOD OF ERROR CONTROL CODING AND DECODING OF MESSAGES IN A PACKET-BASED DATA TRANSMISSION SYSTEM

(75) Inventor: Michael Lewis, Märsta (SE)

(73) Assignee: Infineon Technologies Wireless Solutions Sweden AB, Kista (SE)

( * ) Notice: Subject to any disclaimer, the term of this patent is extended or adjusted under 35 U.S.C. 154(b) by 482 days.

(21) Appl. No.: 10/703,984

(22) Filed: Nov. 7, 2003

(65) Prior Publication Data
US 2004/0111663 A1    Jun. 10, 2004

Related U.S. Application Data

(60) Provisional application No. 60/424,727, filed on Nov. 8, 2002.

(51) Int. Cl.
H03M 13/00 (2006.01)

(52) U.S. Cl. ............... 714/776; 714/781; 714/758; 370/351

(58) Field of Classification Search ........ 714/776, 714/781, 758; 370/351
See application file for complete search history.

(56) References Cited

U.S. PATENT DOCUMENTS 5,524,106 A     6/1996 Tremel et al. ............ 370/13
6,349,138 B1 *  2/2002 Doshi et al. ............. 380/200
6,577,630 B1 *  6/2003 Markwalter et al. ..... 370/392
6,671,284 B1 * 12/2003 Yonge et al. ............. 370/462
6,999,446 B1 *  2/2006 Hall et al. ............... 370/349
2002/0019966 A1 2/2002 Yagil et al. .............. 714/752

FOREIGN PATENT DOCUMENTS

EP          1 202 515 A2    5/2002
WO          WO 99/62226    12/1999
WO          WO 02/13440     2/2002

* cited by examiner

Primary Examiner—Albert Decady
Assistant Examiner—Esaw Abraham
(74) Attorney, Agent, or Firm—Baker Botts L.L.P.

(57) ABSTRACT

Initially the message frame comprising a header with length information, a data portion and a check sequence is expanded with gaps inserted to the data portion and the frame check sequence and the frame length information is updated, the frame is then scrambled and forward error correction data is generated and written into the gaps. An outer check sequence is generated and appended as part of the frame, after which the entire frame is transmitted. Error control decoding of the transmitted frame is achieved between reception and descrambling at a receiving device. The outer check sequence is optionally checked and removed, an error correction algorithm is applied to the frame in response to errors, after which the frame is descrambled, the forward error correction data and the inserted gaps are removed and the frame is restored to its original state and the length information is updated to its original value.

9 Claims, 10 Drawing Sheets

Transmit and receive processes for PHY FEC, alternative 2

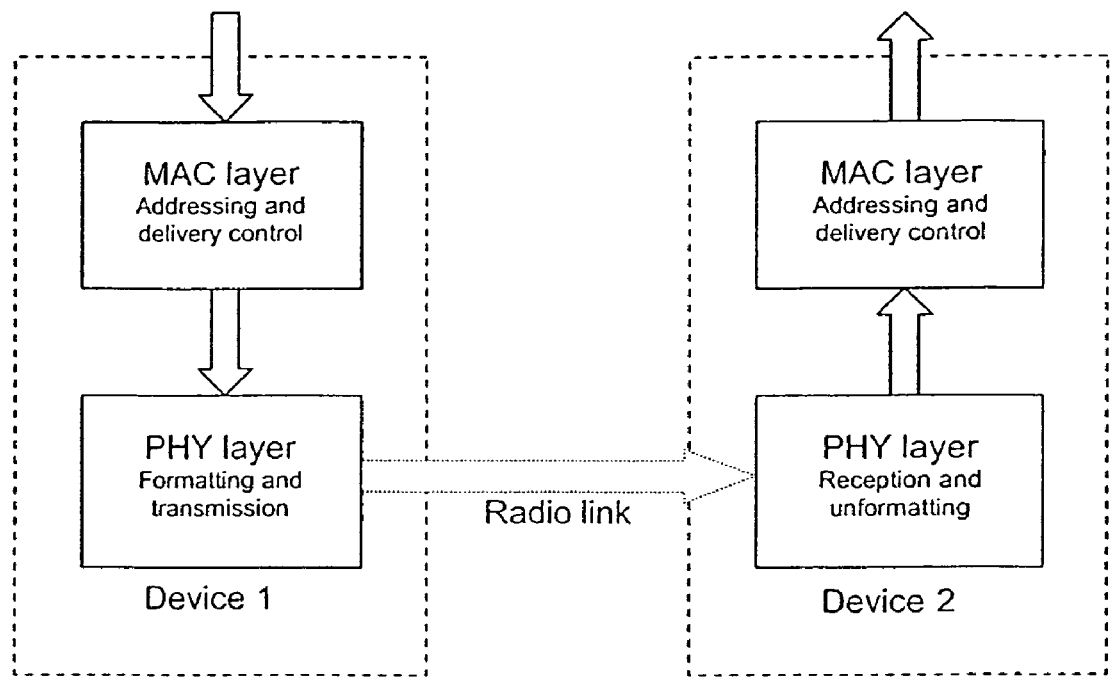
Figure 1 Example of 802.11 WLAN protocol stack

| MAC header | Frame body | FCS |
|---|---|---|
| 32 | N | 4 |

(a) Conventional 802.11 MAC frame format

| MAC header | Frame body | | | | | | | | | | FCS |
|---|---|---|---|---|---|---|---|---|---|---|---|
| | FEC | DATA | FEC | DATA | FEC | DATA | FEC | DATA | FCS | FEC | |
| 32 | 16 | 208 | 16 | 208 | 16 | 208 | 16 | 4-208 | 16 | 4 | |

(b) 802.11e FEC MAC frame format

Figure 2 802.11 MAC and 802.11e FEC MAC frame formats

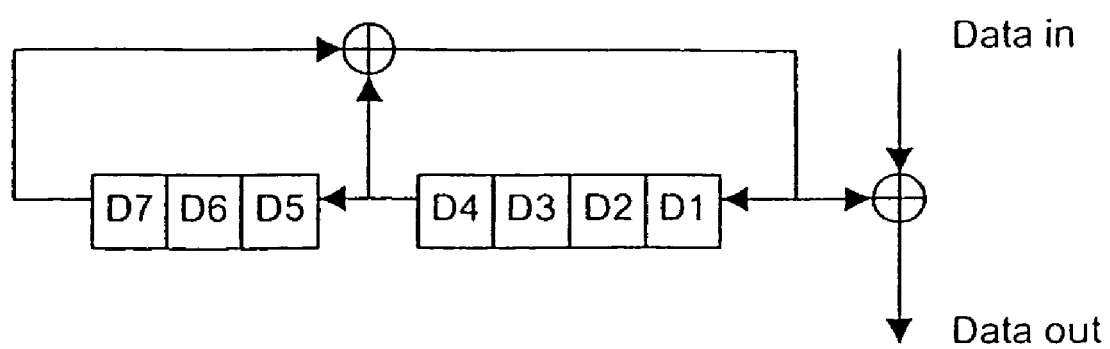
Figure 3 802.11a PHY scrambler

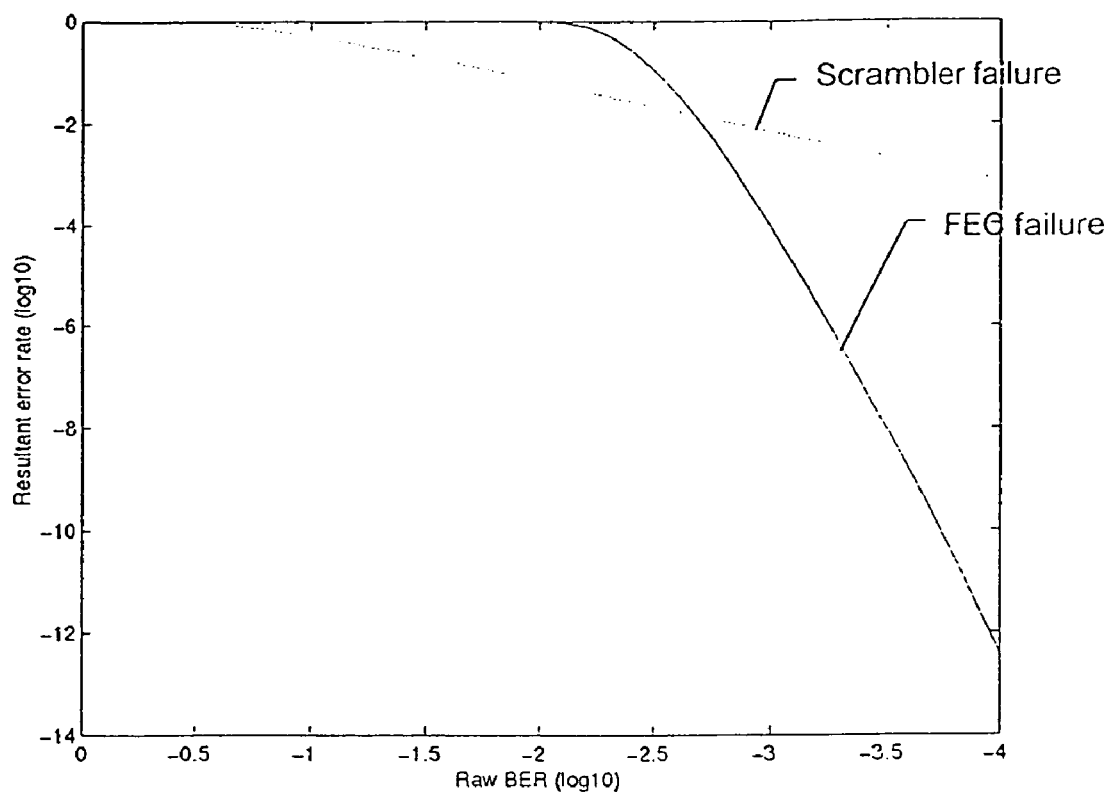
Figure 4 Probabilities of packet error due to scrambler failure and FEC failure

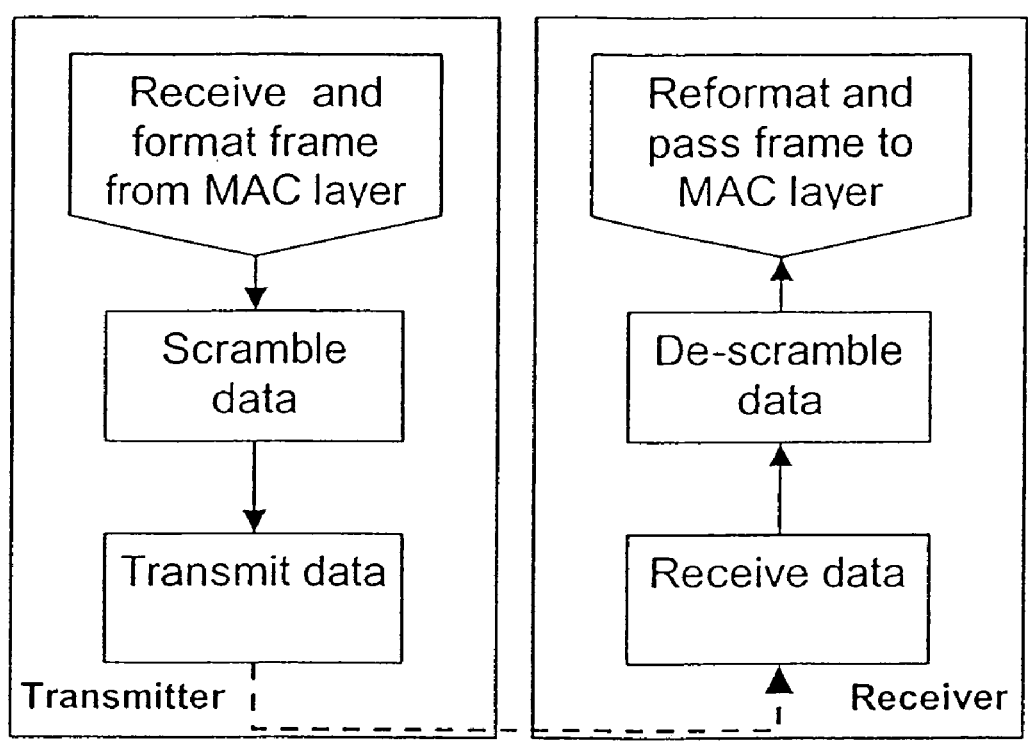
Figure 5 Procedure at transmitter and receiver for conventional 802.11 PHY

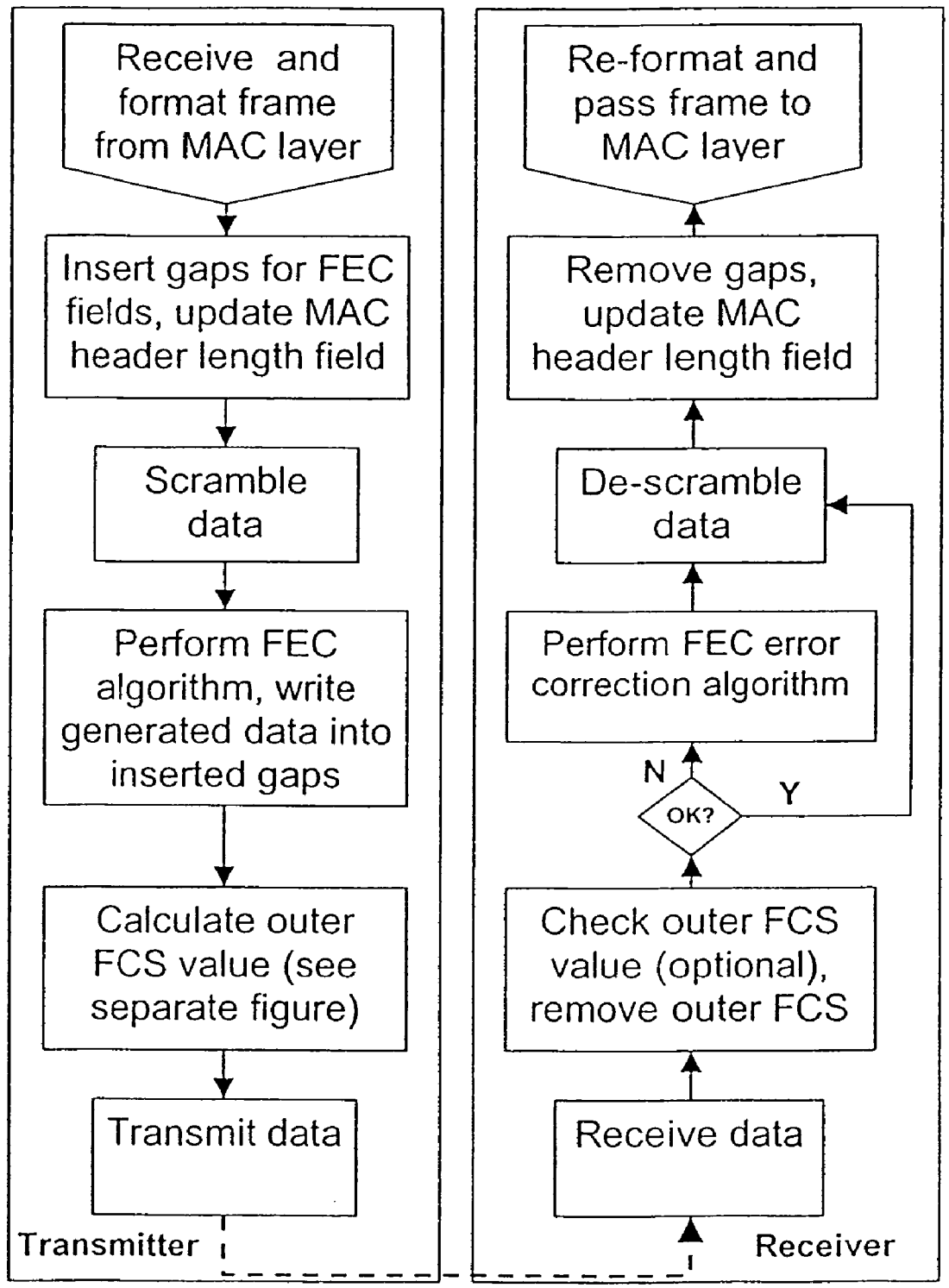
Figure 6 Transmit and receive processes for PHY FEC, alternative 1

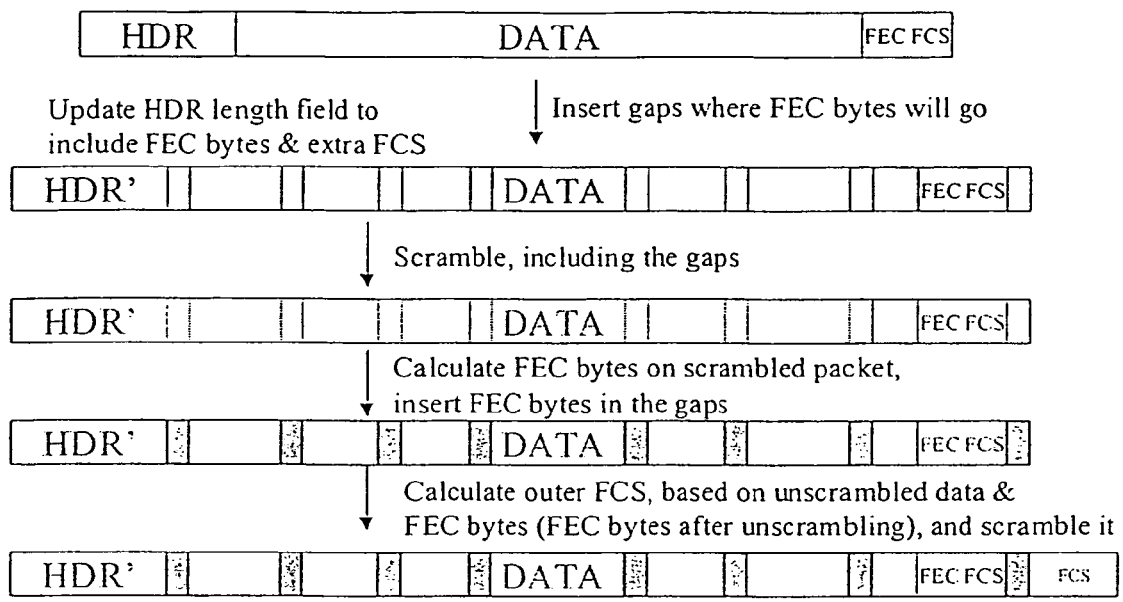
Figure 7 Different stages for PHY-layer FEC insertion (alternative 1)

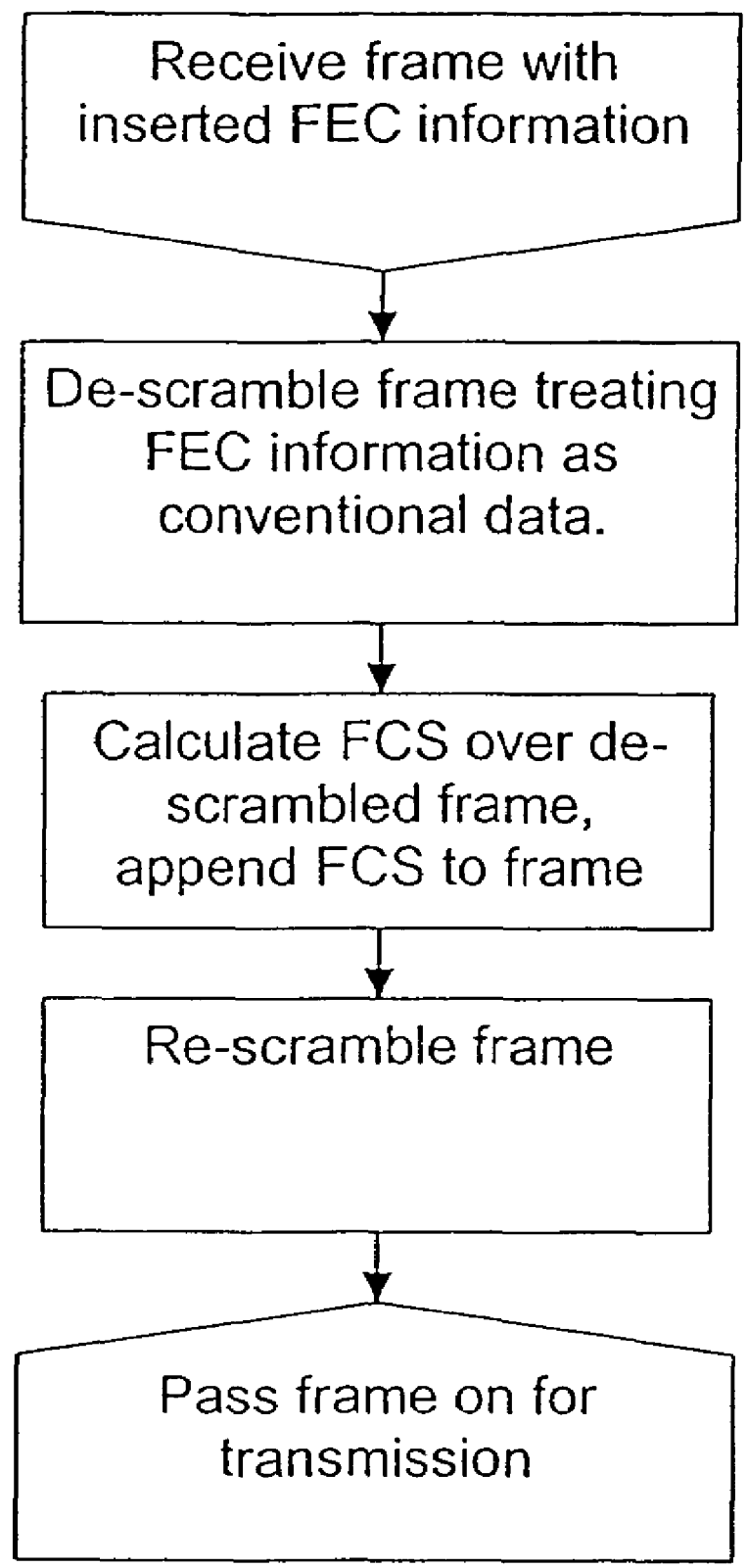
Figure 8 Generation of outer FCS

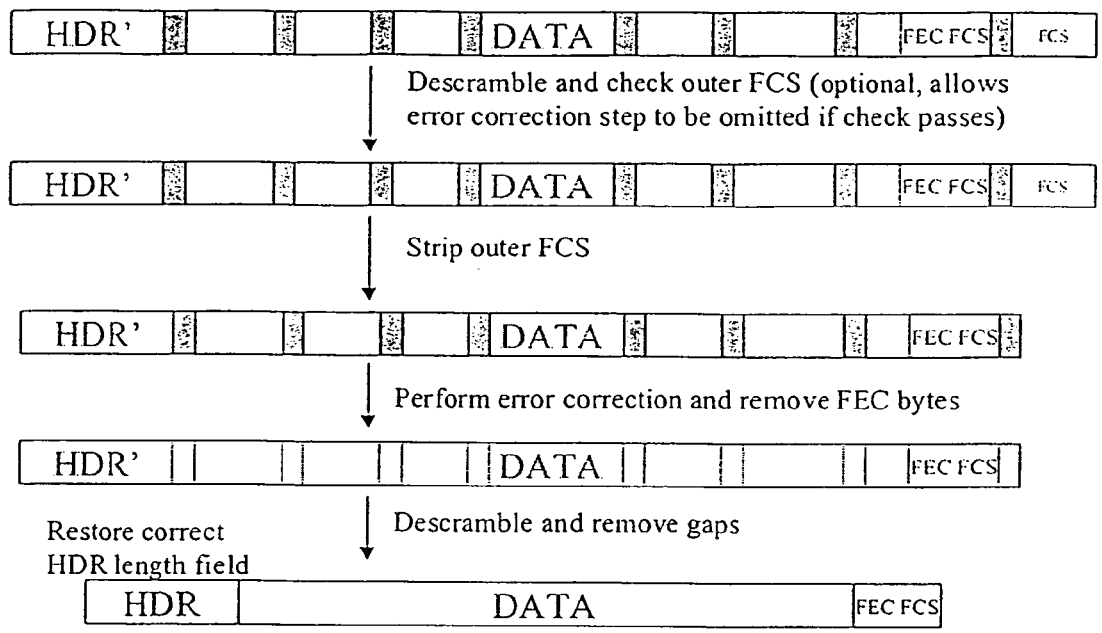
Figure 9 Different stages for PHY-layer error correction and FEC removal (alternative 1)

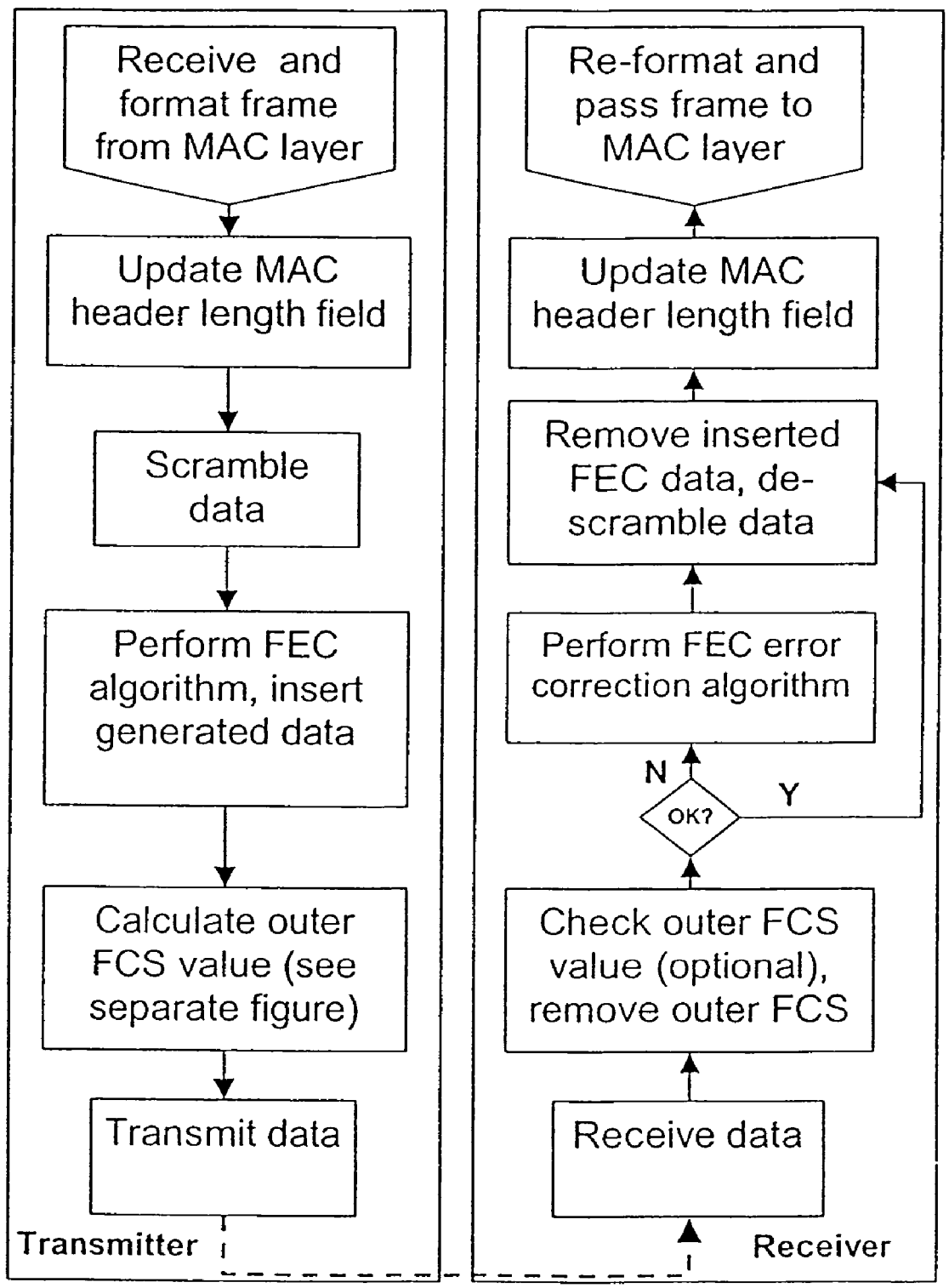
Figure 10 Transmit and receive processes for PHY FEC, alternative 2

METHOD OF ERROR CONTROL CODING AND DECODING OF MESSAGES IN A PACKET-BASED DATA TRANSMISSION SYSTEM

CROSS REFERENCE TO RELATED APPLICATION

This application claims the benefit of U.S. provisional application No. 60/424,727 filed Nov. 8, 2002, the contents of which are hereby incorporated by reference in their entirety.

TECHNICAL FIELD OF THE INVENTION

The invention relates to packet-based data transmission systems in general, and more specifically to a method for error control coding and decoding of messages in packet-based wireless local area networks, where enhanced error control is desired while maintaining backwards compatibility with legacy devices.

BACKGROUND OF THE INVENTION

Protocol Stacks and the 802.11 Wireless LAN Standard

Data communication systems are frequently described in terms of a so called protocol stack, which groups the sequences of tasks required to operate the system into logically related groups known as layers. Conceptually, higher layers have a higher level of abstraction; e.g. the user applications are at the highest layer while the circuits responsible for transmitting the data e.g. over the air or over a copper wire are at the lowest layer.

An example of this is the 802.11 wireless local area network (WLAN) standard, as represented in simplified form in FIG. 1. The 802.11 protocol stack is divided into the so-called MAC (medium access control) layer and the so-called PHY (physical) layer. When a transmitting device is transmitting, the MAC layer of the device takes messages from the layer above, prepends addressing and control information and appends error-checking information, and determines that the wireless medium is free, and passes the expanded message to the PHY layer of the transmitting device. The PHY layer formats the data for transmission, adds PHY-specific information (e.g. a preamble and transmission rate information), modulates the data and transmits it onto the antenna. At a receiving device, the peer PHY layer receives the transmitted data, using the PHY-specific information, and passes the MAC-level message to the MAC layer. Here, the received message is checked for errors, and if the message is addressed to the device in question the data is passed up to the higher layer.

One of the benefits of this logical organization into separate layers is that functions specific to an individual layer can be added or enhanced while retaining compatibility with other layers in the system, and different physical layers can be implemented. For instance, the original 802.11 WLAN standard defines PHY layers operating over radio or infrared links, while the 802.11a enhancement to the 802.11 standard offers a higher rate of data transmission (up to 54 Mbp/s) over a radio link. At the MAC layer, the 802.11e draft standard offers a number of enhancements to the basic 802.11 MAC protocol to support better throughput, and better scheduling data delivery.

FIG. 2a shows the basic structure of an 802.11 MAC data frame as exchanged with the PHY layer. The first 32 bytes of the data frame are the MAC header, which contains control and addressing information, including the total transmitted duration of the frame (which depends on the length and the transmission rate). There then follows a variable-length data field, which contains the actual message. Finally, a 4-byte cyclic redundancy checksum called the frame check sequence (FCS) is calculated on the data frame and appended. This gives the receiver the ability to detect whether an error has occurred in transmission.

Forward Error Correction

The 802.11e draft, at one stage in its development, contained a proposal to implement error control coding at the MAC layer. This error control coding (called forward error correction or FEC) is a standard technique that adds a known amount of redundancy to the data in such a way that a number of transmission errors can be corrected at the receiver. This is very important in quality-of-service applications, since reducing the probability of packet errors reduces the average number of retransmissions required and thereby helps reduce the average delay in transmission.

A key aspect of the proposal was backward compatibility: for protocol reasons, it is important that non FEC-aware stations are able to receive and decode the MAC header. The proposed solution was the frame format shown in FIG. 2b. Firstly, a frame check sequence is calculated over the header and data, and is appended to the frame. This is called the FEC FCS since it is only used by FEC-aware stations to detect errors after decoding.

A number of 16-byte FEC blocks are added to the frame using Reed-Solomon coding, over the frame including the inner FEC FCS. The first of these blocks occurs after the MAC header: this means that from the point of view of a non FEC-aware station, the FEC information is part of the data frame and is not interpreted.

Finally, the frame is treated as if it was a non-FEC data frame, and an outer FCS is calculated. This allows non FEC-aware stations to determine whether they have received the frame correctly (and therefore can make use of the header information, as that is all that they are concerned with).

Interaction with the 802.11a PHY Layer

The 802.11a high-rate PHY layer offers data rates of up to 54 Mbps operating in the 5 GHz radio band. The 802.11g draft PHY standard uses an essentially identical modulation format in the 2.4 GHz radio band, and so the issues discussed here apply to the majority of new IEEE 802.11 WLAN equipment when trying to benefit from MAC-level FEC.

The 802.11a PHY layer takes the MAC-layer frame, and performs scrambling on the data in order to make the characteristics of the transmitted modulated sequence independent of the message being transmitted. The scrambler circuit specified in the 802.11a standard is shown in FIG. 3, and is made up of a linear feedback shift register whose output is XORed with the incoming data. The sequence generated is uniquely defined by the initial state of the delay elements D1–D7, which is known as the seed value for the scrambler. The standard defines that this seed value should be set to a pseudo-random non-zero state for each message transmitted.

At the receiver, the same seed value must be loaded into the delay elements. The same sequence can then be generated at the receiver and XORed with the incoming data stream, thereby recovering the original data. For this to be possible, a sequence of 7 zero bits is prepended to the message (followed by 9 bits whose use is reserved for future supplements to the standard). The whole prepended 16-bit field is called the service field. Since the original data is known to be zero for the initial 7 bits, it is possible to deduce the initial state of the scrambler from the transmitted sequence.

Clearly, correct function of the design is dependent on successfully receiving these 7 bits so as to be able to initialize the scrambler correctly. If the scrambler is incorrectly initialized, the entire subsequent message will be corrupted since the wrong sequence will be generated. When the original 802.11a standard was formulated, there was no error correction proposed in the MAC layer, so this propagation of errors was unimportant: any error would mean that the message would be discarded. However, when trying to implement MAC-level error correction, this error propagation severely limits the level of error correction that is possible at medium to high signal to noise ratios. Fundamentally, the probability that a frame must be discarded becomes dominated by the probability of having one or more bit errors in the 7-bit scrambler initialization sequence rather than the probability of having an error in the data that cannot be corrected.

These differences are shown graphically in FIG. 4: the unbroken line shows the probability of more than 8 octet errors occurring in a given block of 224 (i.e. the probability of an FEC failure) for a given underlying bit error rate, on the assumption that bit errors are independent of one another. The dashed line shows the probability of one or more errors occurring in the scrambler initialization field (the probability of a scrambler failure). It is clear that at underlying bit error rates higher than approximately $10^{-2.7}$, the chance of the FEC failing (more than 8 octet errors in any given 224 octet FEC block) is greater than the chance of an error in the 7 bits of the scrambler error. However, when the underlying bit error rate decreases, the theoretical resulting packet error rate with FEC should rapidly become very small, but this does not happen due to the error propagation problem with the descrambler.

For the 802.11b PHY, data is also scrambled. In this case, a so-called self synchronizing scrambler is used which has the advantage that the corresponding descrambler synchronizes with the transmitting scrambler automatically after a number of correctly received information bits, without the need for the scrambler seed to be transmitted separately. However, on the event of a transmission error this synchronization must occur again, leading to more errors appearing at the output of the scrambler than appeared at the input.

In typical applications where MAC level forward error correction is desired, such as distribution of audio and video data streams, the tolerable bit error rate is generally low. The difference between the theoretical performance from the FEC system and the limit caused by scrambler error propagation, particularly for 802.11a, means that a higher transmit power or a lower range must be accepted to maintain a given level of performance in these cases.

The comments made by the task group responsible for the 802.11e draft standard were basically that error control coding is most properly located in the PHY layer. The reason for this is that it is then possible to perform the error control coding step after scrambling of the data has been performed, and therefore to correct transmission errors (including errors in the transmitted scrambler seed) before descrambling and possible error propagation occurs. Such modifications were outside the scope of the 802.11e task group. Any such modification would also have the additional requirement that non FEC-aware devices (e.g. using a standards-compliant 802.11a or 802.11b PHY layer) must be able to receive at least the MAC header and determine correct transmission via the FCS. However, there are presently no known solutions for error control coding at the PHY layer.

The difficulty with incorporating error control coding at the PHY layer lies in making sure that current (legacy) standard-compliant devices are able to decipher the header portion of the message correctly, and determine whether the frame was correctly received.

SUMMARY OF THE INVENTION

There is thus a need for a method that enables error control coding with a reduced risk of error propagation and at the same time enables legacy devices to be able to decode at least the header of the frame.

The aim of the invention is to provide a method for error control coding and decoding of messages in a packet-based data transmission system, more specifically in a packet-based wireless local area network.

This is achieved, according to the invention, with a method whereby a frame comprising a header, a data portion and a frame check sequence from the MAC-layer is received at the PHY-layer of a transmitting device and expanded with gaps and forward error correction data is generated and written into the gaps. The expanded frame with the inserted error correction data is then scrambled and an outer frame check sequence is generated and appended to the frame, after which the entire frame is transmitted. The frame is received at the PHY-layer of a receiving device. The outer frame check sequence is checked and in response to errors an error correction algorithm is applied, after which the frame is descrambled, the forward error correction data is removed and the frame is restored to its original state.

Another aim of the invention is to provide a method for error control coding and decoding of messages that enables current standard compliant devices, so called legacy devices, to decode the header part of the received frame without necessarily being able to decode the data portion of the received frame. It is, however, not important that legacy devices are able to decode the data portion of the frame, since the proposed solution will only be used between two devices that are aware of the method and have negotiated its use by some higher-level protocol.

In order to gain full benefit from error control coding, it is necessary to perform the error control encoding step between scrambling of the frame and transmission from a transmitting device, and to correct errors between reception and descrambling at a receiving device. However, to maintain backward compatibility, it is likewise necessary that correct reception of the whole packet can be verified by a conventional 802.11 device and that the header field can be decoded by such a device.

BRIEF DESCRIPTION OF THE DRAWINGS

The invention will be described more in detail below with reference to the appended drawing in which:

FIG. 1 shows an example of a 802.11 WLAN protocol stack,

FIG. 2a shows a conventional 802.11 MAC frame format,

FIG. 2b shows a 802.11e FEC MAC frame format,

FIG. 3 shows an 802.11a PHY scrambler,

FIG. 4 shows the probabilities of packet error due to scrambler failure and FEC failure, FIG. 5 shows a flow chart of a known procedure at a transmitter and a receiver for conventional 802.11 PHY layer, FIG. 6 shows a flow chart of a first embodiment of the method according to the invention, FIG. 7 shows different stages at a transmitting device of the first embodiment of the method according to the invention, FIG. 8 shows a flow chart of a method of generating an outer frame check sequence according to the invention, FIG. 9 shows the different stages at a receiving device of the first embodiment of the method according to the invention, FIG. 10 shows a flow chart of a second embodiment of the method according to the invention.

DESCRIPTION OF A PREFERRED EMBODIMENT OF THE INVENTION

The proposed method according to the invention is exemplified using a similar structure for the error control coding to that which was proposed in the 802.11e standard draft, but this structure is in no way required; the inventive portion is how a general forward error correction algorithm may be applied to a frame at the PHY layer, after scrambling, without affecting compatibility with legacy 802.11 devices. The sequence performed on a frame by a conventional 802.11 PHY layer is shown in FIG. 5, where for simplicity such tasks as prep ending of scrambler seed in an 802.11a PHY layer or preamble sequence for an 802.11b PHY layer are included under the general heading formatting of data.

Two different embodiments of a method according to the invention between a transmitting device and a receiving device are described in relation to FIGS. 6–10. The first embodiment has the advantage that it is slightly easier to perform the scrambling and generate the outer FCS, while the second embodiment has the advantage that it is slightly easier to perform the descrambling in an 11b system.

A flow chart of the first embodiment of the method according to the invention is shown in FIG. 6. The effect of the different stages of the method at a transmitting device on the frame are shown in FIG. 7 (with an 802.11e-like FEC structure being shown as an example, but almost any FEC algorithm can be applied).

At the Transmitting Device:

The PHY layer of a transmitting device receives and formats a conventional 802.11 frame from the MAC layer, including a header (which includes frame length information), a data portion and FCS (or FEC FCS). For the case of 802.11a (or other PHY standards based on 802.11a), the header must also have the 16-bit-Service field (all zeros) prepended to it to allow the descrambler initialization value to be protected by the error control code. It is possible, and may be desirable, to also protect other fields added by the PHY layer.

Beginning from after the header of the frame, the frame is expanded by means of making spaces or inserting gaps into the frame to accommodate any desired extra FEC information. These gaps for the FEC information may be arbitrarily distributed; in addition it is possible to perform interleaving as part of applying FEC on the information after the header portion to further enhance FEC performance, and possibly to duplicate the header portion for further protection. For clarity, FIG. 7 shows a simple distribution of FEC data as block-based checksums, resembling the former 802.11e FEC proposal.

In order to allow interpretation by legacy devices, the length information in the header of the frame is then updated to correspond to the length of the frame including the inserted gaps for the FEC information and also enabling including an outer frame check sequence. The thus expanded frame is subsequently scrambled, according to the standard scrambling technique defined for the PHY layer of the transmitting device. A chosen scrambling algorithm is thereby applied to at least part of the frame, whereby a scrambled frame is achieved. In an 802.11a system, only a very small part of the PHY-specific header information is scrambled (the all-zeros service field). In an 802.11b system, the entire frame including the preamble is scrambled.

A FEC algorithm is then applied to at least part of the scrambled frame, thereby generating FEC data that is subsequently placed into the gaps that were previously inserted: if interleaving of the data is also performed, the position of these gaps may change during the process.

Finally, the so-called outer frame check sequence (OFCS) is generated. This OFCS is defined as being that which would be calculated if the frame were descrambled by a non-FEC PHY receiver. The OFCS is then scrambled and included or appended in the scrambled frame. One possible process for generating this OFCS is shown in FIG. 8: it should be noted that any process which provides an FCS value that, on correct reception of the frame by a non FEC-aware receiver, agrees with the value calculated by that receiving device, is applicable. In a practical implementation, it is possible to combine generating the outer frame check sequence with the process of scrambling and generating the FEC data, to improve efficiency.

The process for generating an OFCS according to the invention as illustrated in the flow chart in FIG. 8 is described below. The scrambled frame is descrambled by means of applying a known descrambling algorithm to the frame, including the FEC data. An OFCS is calculated over at least part of the descrambled frame including the FEC data, and subsequently included in or appended to the descrambled frame. Finally, the descrambled frame including the OFCS is scrambled. Thereby a scrambled frame with a scrambled outer frame check sequence, that non-FEC aware devices can interpret, is achieved.

At the Receiving Device:

The receiving procedure at the receiving device is also shown in FIG. 6, with the effect of the different stages of the method shown in FIG. 9. The receiving device optionally begins by descrambling the received frame and checking the OFCS (as would occur in a non FEC-aware device or in a FEC-aware system that wishes to take advantage of low probability for transmission errors to skip the error correction step for correctly received frames) or by immediately discarding the OFCS (as would occur in a FEC-aware device that did not wish to perform the OFCS check stage).

The first option of the method in FIG. 6 and FIG. 7 according to the invention is performed by means of calculating an FCS over the descrambled frame except the OFCS, and then comparing the two values. This step allows the receiving device to bypass the error correction mechanism and reduce the amount of processing required on error-free packets, which will be a significant saving for low-error environments. The OFCS may then be discarded from the scrambled frame, since the inner FCS or FEC FCS will indicate the success or otherwise of the decoding of the data.

If the OFCS was determined to be incorrect or the OFCS was discarded without being checked, then a chosen error correction mechanism is invoked on at least part of the remainder of the scrambled frame. This error correction mechanism is based on the inserted FEC data. The resulting (hopefully error-free) frame is then descrambled according to the appropriate mechanism defined for the PHY layer of the receiving device. For an 802.11b descrambler, or any other self-synchronizing descrambler, it is necessary to calculate the correct descrambler state following the FEC data. This can be done by replacing the inserted FEC data with a scrambled form of the gap data inserted at the transmitting device. The scrambling sequence to apply to the gap data in each case can readily be determined from the data immediately prior to the gap.

For either of a correct OFCS, or an incorrect OFCS, or an unchecked OFCS, the gaps previously inserted into the frame at the transmitting device are then discarded; and the length information in the header is restored to its original value. At this point, the result is an 802.11-compliant MAC frame with an included FCS, which may be sent to the MAC layer of the receiving device.

A flow chart of the second embodiment, between a transmitting device and a receiving device, of the method according to the invention is shown in FIG. 10.

At the Transmitting Device.

Similarly to the first embodiment according to the invention, the PHY layer of the transmitting device receives a conventional 802.11 frame from the MAC layer, including header, data and FCS (the FEC FCS). For the case of 802.11a (or other PHY standards based on 802.11a), the header must also have the 16-bit Service field (all zeros) prepended to it to allow the descrambler initialization value to be protected by the error control code. It is possible, and may be desirable, to also protect other fields added by the PHY layer.

In order to enable a future expansion of the frame by insertion of forward error correction data and an outer frame check sequence (OFCS) the length field of the header of the received frame is updated. The frame with the updated header is then scrambled according to the standard scrambling algorithm chosen for the PHY layer of the transmitting device.

A predetermined FEC algorithm is applied to the scrambled frame, thereby generating FEC data. This data is inserted into the data portion and the FEC FCS of the scrambled frame. Subsequently an OFCS is generated and included in the scrambled frame in a similar manner to the first embodiment of the method according to the invention, as is illustrated in FIG. 5. The process of generating the OFCS is identical to the first embodiment according to the invention, as shown in FIG. 8.

Finally, the scrambled frame is transmitted.

At the Receiving Device.

The receiving procedure of the second embodiment of the method according to the invention is also shown in FIG. 10. The receiving device may in a similar manner as the first embodiment of the method according to the invention optionally begin by descrambling the received frame and checking the OFCS (as would occur in a non FEC-aware device) or by immediately discarding the OFCS.

The first case of descrambling the received frame and checking the OFCS is performed in a similar manner as the first embodiment of the method according to the invention. If the OFCS is determined to be correct the OFCS is discarded, and the inserted FEC data is removed, and the frame is descrambled.

If the OFCS was determined to be incorrect or the OFCS was discarded without being checked at all, a chosen error correction mechanism is invoked on the remainder of the scrambled frame. Consequently the inserted FEC data is removed and the (hopefully error-free) frame is descrambled according to the appropriate mechanism defined for the PHY layer of the receiving device.

For either of the cases of a checked correct OFCS or a checked incorrect OFCS or an unchecked OFCS, the length information in the header is finally restored to its original value and the frame is reformatted and passed on to the MAC layer of the receiving device.

Receiving Procedure by any non FEC-Capable Device

To a non FEC-capable receiving device overhearing the transmitted frame, according to either of the described embodiments of the method according to the invention, the expanded MAC frame appears to be a valid 802.11 MAC frame with a correct header, a data portion, and a valid frame check sequence. Since a receiving device other than the intended recipient will not interpret the data section, the additional FEC process is invisible.

The method according to the invention can also be performed at a device that is provided to be aware of the structure of the FEC frame but chooses not to implement the error correction algorithm: such a device could decode the data in such a frame, but could not take advantage of improved robustness against errors (and indeed would have a slightly higher error rate due to the longer expanded frame). This would be useful, for instance, in a low-cost device that wishes to-receive data broadcast with error control coding applied.

The method according to the invention provides a mechanism for incorporating forward error correction into the 802.11a/g and 802.11b PHY layers while maintaining backwards compatibility at the protocol level with devices which do not implement the technique (i.e. all stations can decode the protocol specific parts of the frame, but only FEC capable devices can decode the data part of the frame). This technique could be used in a proprietary solution, or could form the basis for a new extension to the IEEE 802.11 standard.

The method according to the invention is generally applicable to any packet-based data transmission system, wireless or otherwise, where it is desired to add PHY-layer error control while maintaining backwards compatibility with regard to decoding protocol-specific (i.e. non-data) portions of transmitted packets.

I claim:

1. A method of error control coding and decoding of messages in a packet-based data transmission system, where each message comprises a header, which includes frame length information, a data portion and a frame check sequence, comprising the steps of:
    at a transmitting device:
        a) receiving said message including the header, the data portion and the frame check sequence and inserting gaps into the data portion and the frame check sequence of the frame,
        b) updating the length information of the header to reflect the length of the frame including the gaps and a future outer frame check sequence,
        c) applying a scrambling algorithm to at least part of the frame,
        d) applying a forward error correction algorithm to at least part of the frame scrambled in step c) to generate forward error correction data,
        e) inserting the generated forward error correction data into the gaps, f) generating a scrambled outer frame check sequence and including the scrambled outer frame check sequence in the frame, g) transmitting the scrambled frame with the forward error correction data and the outer frame check sequence, at a receiving device:

h) receiving the scrambled frame with the forward error correction data and the scrambled outer frame check sequence, i) checking whether or not the scrambled outer frame check sequence is correct, j) if yes, removing the outer frame check sequence, removing the forward error correction data, descrambling the frame, removing the gaps, and updating the length information of the header to its original value, k) if no, removing the outer frame check sequence, applying an error correction algorithm based on the inserted forward error correction data to at least part of the remainder of the frame, removing the inserted forward error correction data, descrambling the frame, removing the inserted gaps, and updating the length information of the header to its original value.

2. The method according to claim 1, wherein the step of generating the scrambled outer frame check sequence comprises descrambling the scrambled frame including the forward error correction data, calculating an outer frame check sequence over at least part of the frame, including the calculated outer frame check sequence in the unscrambled frame and re-scrambling the frame with the outer frame check sequence.

3. A method of error control coding and decoding of messages in a packet-based data transmission system, where each message comprises a header, which includes frame length information, a data portion and a frame check sequence, comprising the steps of:

at a transmitting device:

a) receiving said message including the header, the data portion and the frame check sequence and inserting gaps into the data portion and the frame check sequence of the frame, b) updating the length information of the header to reflect the length of the frame including the gaps and a future outer frame check sequence, c) applying a scrambling algorithm to at least part of the frame d) applying a forward error correction algorithm to at least part of the frame scrambled in step c) to generate forward error correction data, e) inserting the generated forward error correction data into the gaps, f) generating a scrambled outer frame check sequence and including the scrambled outer frame check sequence in the frame, g) transmitting the scrambled frame with the forward error correction data and the scrambled outer frame check sequence, at a receiving device, h) receiving the scrambled frame with the forward error correction data and the scrambled outer frame check sequence, i) discarding the scrambled outer frame check sequence, applying an error correction algorithm based on the forward error correction data to at least part of the remainder of the frame, removing the forward error correction data, descrambling the frame, removing the gaps, and updating the length information of the header to its original value.

4. The method according to claim 3, wherein the step of generating the scrambled outer frame check sequence comprises descrambling the scrambled frame including the forward error correction data, calculating an outer frame check sequence over at least part of the frame, including the calculated outer frame check sequence in the unscrambled frame and re-scrambling the frame with the outer frame check sequence.

5. A method of error control coding and decoding of messages in a packet-based data transmission system, where each message comprises a header, which includes frame length information, and a data portion, and a frame check sequence, comprising the steps of:

at a transmitting device:

a) receiving said message including the header, the data portion and the frame check sequence and updating the length information of the header in order to allow for a future expansion of the length of the frame, b) applying a scrambling algorithm to at least part of the frame, c) applying a forward error correction algorithm to at least part of the frame scrambled in step b) to generate forward error correction data, d) inserting the generated forward error correction data into the data portion and the frame check sequence of the scrambled frame, e) generating a scrambled outer frame check sequence and including the scrambled outer frame check sequence in the frame, f) transmitting the scrambled frame with the forward error correction data and the scrambled outer frame check sequence, at a receiving device:

g) receiving the transmitted scrambled frame with the forward error correction data and the scrambled outer frame check sequence, h) checking whether or not the scrambled outer frame check sequence is correct, i) if yes, removing the scrambled outer frame check sequence, removing the forward error correction data from the frame, descrambling the frame and restoring the length information of the header to its original value, j) if no, removing the scrambled outer frame check sequence, applying an error correction algorithm to at least part of the frame based on the forward error correction data, removing the inserted forward error correction data from the frame, descrambling the frame and restoring the length information of the header to its original value.

6. The method according to claim 5, wherein the step of generating the scrambled outer frame check sequence comprises de scrambling the scrambled frame with the forward error correction, calculating an outer frame check sequence over at least part of the frame, including the calculated outer frame check sequence in the unscrambled frame and re-scrambling the frame with the outer frame check sequence.

7. A method of error control coding and decoding of messages in a packet-based data transmission system, where each message comprises a header, which includes frame length information, and a data portion, and a frame check sequence, comprising the steps of:

at a transmitting device:

a) receiving said message including the header, the data portion and the frame check sequence and updating the length field of the header in order to allow for a future expansion of the length of the frame, b) applying a scrambling algorithm to at least part of the frame, c) applying a forward error correction algorithm to at least part of the frame scrambled in step b) to generate forward error correction data, d) inserting the generated forward error correction data into the data portion and the frame check sequence of the scrambled frame, e) generating a scrambled outer frame check sequence and including the scrambled outer frame check sequence in the frame, f) transmitting the scrambled frame with the forward error correction data and the scrambled outer frame check sequence, at a receiving device, g) receiving the transmitted scrambled frame with the forward error correction data and the scrambled outer frame check sequence, h) discarding the scrambled outer frame check sequence, applying an error correction algorithm to the frame based on the forward error correction data, removing the inserted forward error correction data from the frame, descrambling the frame and restoring the length information of the header to its original value.

8. The method according to claim 7, wherein the step of generating the scrambled outer frame check sequence comprises descrambling the scrambled frame including the forward error correction data, calculating an outer frame check sequence over at least part of the frame, including the calculated outer frame check sequence in the unscrambled frame and re-scrambling the frame with the outer frame check sequence.

9. The method according to any of the above claims, wherein all steps are performed at a physical protocol layer of the transmitting device and the receiving device, respectively.

* * * * *